United States Patent
Li

(10) Patent No.: US 7,586,353 B2
(45) Date of Patent: Sep. 8, 2009

(54) ELECTRONIC PULSE-GENERATING DEVICE

(75) Inventor: Cheng-Yi Li, Tu-Cheng (TW)

(73) Assignee: Chi Mei Communication Systems, Inc., Tu-Cheng, Taipei County (TW)

( * ) Notice: Subject to any disclaimer, the term of this patent is extended or adjusted under 35 U.S.C. 154(b) by 0 days.

(21) Appl. No.: 11/967,104

(22) Filed: Dec. 29, 2007

(65) Prior Publication Data

US 2009/0128205 A1    May 21, 2009

(30) Foreign Application Priority Data

Nov. 20, 2007   (CN) .................. 2007 1 0202607

(51) Int. Cl.
*H03K 3/00* (2006.01)

(52) U.S. Cl. ...................... 327/291; 327/298

(58) Field of Classification Search ............ None
See application file for complete search history.

(56) References Cited

U.S. PATENT DOCUMENTS

| | | | | |
|---|---|---|---|---|
| 3,188,486 A | * | 6/1965 | Favin | 327/184 |
| 3,195,456 A | * | 7/1965 | Charlwood et al. | 101/184 |
| 3,508,167 A | * | 4/1970 | Russell, Jr. | 331/111 |
| 5,661,376 A | * | 8/1997 | George | 315/368.21 |

* cited by examiner

*Primary Examiner*—Cassandra Cox
(74) *Attorney, Agent, or Firm*—Steven M. Reiss

(57) ABSTRACT

An electronic pulse-generating device (100) includes an input circuit (10) and an output circuit (20). The input circuit includes an input connector (11), a first resistor (R1) and a capacitor (12). The capacitor has one lead electronically connected to the input connector and another lead electronically connected to the first resistor. The output circuit includes a transistor (21) and an output connector (22) electronically connected to a collector of the transistor. The first resistor is connected to a base of the transistor, and an emitter of the transistor is grounded.

9 Claims, 2 Drawing Sheets

… … …

ELECTRONIC PULSE-GENERATING DEVICE

BACKGROUND OF THE INVENTION

1. Field of the Invention

The present invention relates to an electronic pulse-generating device, particularly to an electronic pulse-generating device configured for generating electronic pulses to activate a reset IC.

2. Description of Related Art

Integrated circuits are used in many electronic devices. Nowadays, reset ICs are widely used in automobile electronic systems. In use, a reset IC is generally activated by an electronic pulse. However, a voltage supplied by a typical power supply of an automobile electronic system is generally variable over a broad range of about 2V-20V. When a reset IC is used in an automobile electronic system, it may be damaged by such unstable/variable voltage.

Therefore, a new electronic pulse-generating device is desired in order to overcome the above-described shortcomings.

SUMMARY

An electronic pulse-generating device includes an input circuit and an output circuit. The input circuit includes an input connector, a first resistor and a capacitor. The capacitor has one lead electronically connected to the input connector and another lead electronically connected to the first resistor. The output circuit includes a transistor and an output connector electronically connected to a collector of the transistor. The first resistor is connected to a base of the transistor, and an emitter of the transistor is grounded.

Other advantages and novel features will become more apparent from the following detailed description when taken in conjunction with the accompanying drawings.

BRIEF DESCRIPTION OF THE DRAWINGS

Many aspects of the present electronic pulse-generating device can be better understood with reference to the following drawings. The components in the various drawings are not necessarily drawn to scale, the emphasis instead being placed upon clearly illustrating the principles of the present electronic pulse-generating device. Moreover, in the drawings, like reference numerals designate corresponding parts throughout the diagrams, in which.

DETAILED DESCRIPTION OF THE INVENTION

Figure 1:
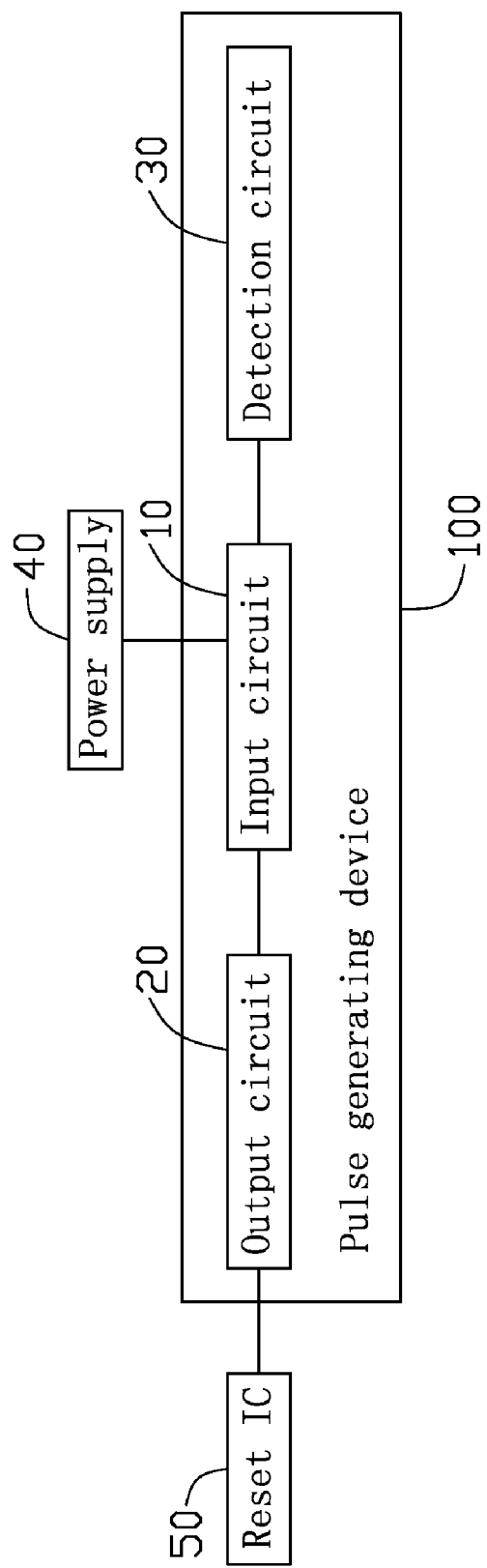
FIG. 1 is a diagram of an electronic pulse-generating device, in accordance with a present embodiment.

Referring to FIG. 1, an electronic pulse-generating device 100 in accordance with a present embodiment is provided. The electronic pulse-generating device 100 includes an input circuit 10, an output circuit 20, and a detection circuit 30. The output circuit 20 and the detection circuit 30 are both electronically connected to the detection circuit 30. The electronic pulse-generating device 100 is connected between a typical power supply 40, which supplies a variable voltage over a broad range, and a reset circuit (reset IC) 50, which transforms an input voltage supplied by the power supply 40 into an electronic pulse to activate the reset IC 50.

Figure 2:
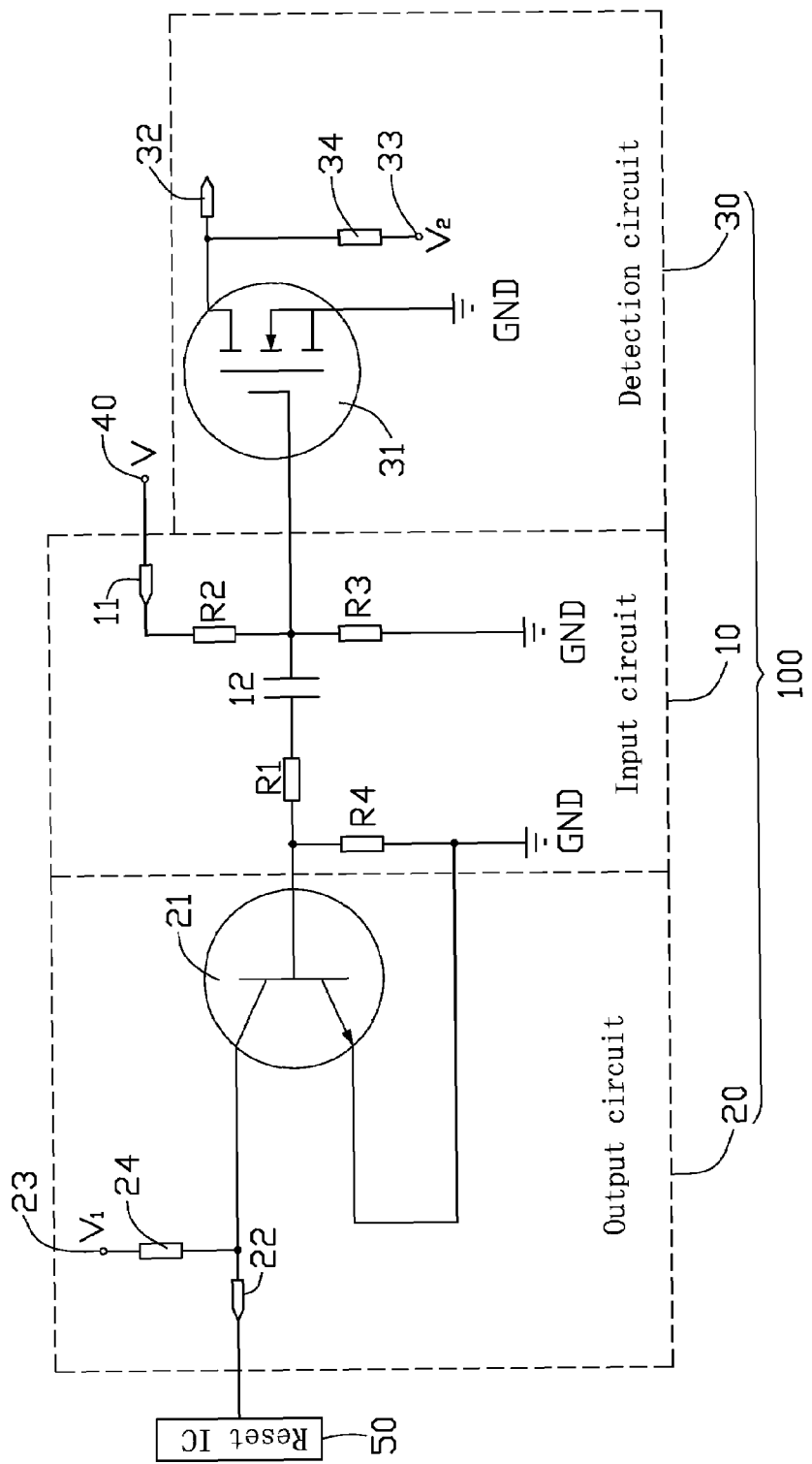
FIG. 2 is a circuit diagram of the electronic pulse-generating device shown in FIG. 1.

Also referring to FIG. 2, the input circuit 10 includes an input connector 11, a capacitor 12, a first resistor R1, a second resistor R2, a third resistor R3, and a fourth resistor R4. The input connector 11 is grounded via the second resistor R2 and the third resistor R3, which are connected in series. The capacitor 12 has one lead connected to the node between the second resistor R2 and the third resistor R3, and the other lead connected to one end of the first resistor R1. The other end of the first resistor R1 is connected to ground through the fourth resistor R4.

The output circuit 20 includes a transistor 21, an output connector 22, and a second power supply 23. The base of the transistor 21 is electronically connected to the node between the first resistor R1 and the fourth resistor R4. The collector of the transistor 21 is electronically connected to both the output connector 22 and the second power supply 23. The emitter of the transistor 21 is grounded. In this way, the second power supply 23 can input a second voltage $V_1$ to the collector of the transistor 21 to switch the transistor 21 on. A protective resistor 24 is installed between the collector of the transistor 21 and the second power supply 23 to protect the second power supply 23.

The detection circuit 30 includes a MOSFET (Metal-Oxide-Semiconductor Field-Effect-Transistor) 31, a detection connector 32, and a third power supply 33. The gate of the MOFSET 31 is electronically connected to the node between the second resistor R2 and the third resistor R3. The source of the MOFSET 31 is grounded. The drain of the MOFSET 31 is electronically connected to both the detection connector 32 and the third power supply 33. In this way, the third power supply 33 can input a third voltage $V_2$ to the drain of the MOSFET 31 to switch the MOFSET 31 on. As in the output circuit 20, a protective resistor 34 is installed between the drain of the MOSFET 31 and the third supply 33 to protect the third power supply 33.

In use, the input connector 11 of the input circuit 10 is electronically connected to the typical power supply 40 of an automobile electronic system to receive an input voltage in a range of, for example, about 2V-20V, and the output circuit 40 outputs an electronic pulse to activate the reset IC 50 of the automobile electronic system. Understandably, the power supply 40 can also be electronically connected to other circuits (not shown) parallel to the reset IC 50 to supply working voltage thereto.

When the power supply 40 is turned off, the transistor 21 and the MOFSET 31 are not switched on. The collector and the emitter of the transistor 21 are essentially isolated from each other, thus the output connector 22 outputs the second voltage $V_1$. Similarly, the drain and the source of the MOSFET 31 are essentially isolated from each other, and so the detection connector 32 outputs the third voltage $V_2$, thus the reset IC 50 is not activated.

When the power supply 40 is turned on, the main voltage $V_0$ is input to the input connector 11. Since the second resistor R2 and the third resistor R3 between the input connector 11 and ground are connected in series, a voltage $V_{R3}$, across the resistor R3 can be calculated according to this formula:

$$V_{R3} = V_0 R3/(R2+R3).$$

Understandably, the voltage $V_X$ can be adjusted by means of changing the value of R2 and/or R3 to be high enough to turn on the MOSFET 31.

The capacitor 12 is charged by the voltage Vx, resulting in a voltage $V_C$ across the capacitor 12. Because the first resistor R1 and the fourth resistor R4 between the capacitor 12 and ground are connected in series, the voltage $V_C$ can be calculated according to this formula:

$$V_C = V_{R3}[1 - e^{-t/C(R1+R4)}],$$

wherein C is capacitance of the capacitor 12, t is time of charging.

A voltage $V_{R4}$ across the resistor R4 can be calculated according to this formula:

$$V_{R4} = V_C R4/(R1+R4).$$

Understandably, the voltage $V_{R4}$ increases together with the voltage $V_C$, and can be adjusted by means of changing the value of R3 and/or R4.

The increasing voltage $V_{R4}$ is then input to the base of the transistor 21, activating the transistor 21 once the turn-on voltage $V_{BE(ON)}$ is reached.

The capacitor 12 discharges when the transistor 21 is switched on. A discharging current I can be calculated according to this formula:

$$I = [V_C/(R1+R4)]e^{-t/C(R1+R4)},$$

wherein t is time of discharging. In this way, when the capacitor 12 begins to discharge, an instantaneous value of $V_C$ is limited to be the turn-on voltage $V_{BE(ON)}$ of the transistor 21, and is not affected by the value of the voltage supplied by the power supply 40.

When the transistor 21 is switched on, the second supply 23 is grounded via the protective resistor and has no effect on the output connector 22. The discharging current I is input to the base of the transistor 21, amplified, and then output from the collector of the transistor 21. According to the aforementioned calculating formula, the discharging current I reaches an instantaneous maximal value at the moment when the transistor 21 is just switched on, and then quickly attenuates. This change of the discharging current I input into the base of transistor 21 is amplified by the transistor 21, thus an electronic pulse is output from the emitter of the transistor 21. The electronic pulse current is then input to the reset IC 50 to activate the reset IC 50.

In the discharging process of the capacitor 12, the voltage $V_C$ of the capacitor 12 continuously decreases. When $V_C$ decreases to be less than the turn-on voltage $V_{BE(ON)}$ of the transistor 21, the transistor 21 is switched off. In this way, the collector and the emitter of the transistor 21 are isolated from each other again, and the output connector 22 outputs the second voltage $V_1$. Since the voltage $V_X$ has already stabilized, the capacitor 12 blocks direct current, thus the electronic pulse-generating device 100 has no effect on other circuits connected in parallel to the power supply 40.

The voltage $V_{R3}$ is also input to the gate of the MOSFET 31 when the power supply 40 is turned on. The MOFSET 31 is then activated, since $V_X$ is higher than the turn-on voltage of the MOFSET 31. In this way, the detection connector 32 outputs a detection current $I_D$ synchronously changing with that of the voltage $V_X$. A working state of the power supply 40 can be detected by means of detecting the detection current $I_D$.

Understandably, the present electronic pulse-generating device 100 can transform a variable input voltage over a broad range into a stable electronic pulse to output and activate the reset IC 50. In this way, the reset IC 50 is protected by the electronic pulse-generating device 100, and can be activated by different types of power supplies via the electronic pulse-generating device 100.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. An electronic pulse-generating device, comprising:
   an input circuit including an input connector, a first resistor, a second resistor, a third resistor and a capacitor, the capacitor having one lead electronically connected to the input connector and another lead electronically connected to the first resistor, the second resistor and the third resistor being connected to each other in series, the input connector being grounded via the second resistor and the third resistor; and
   an output circuit including a transistor and an output connector electronically connected to a collector of the transistor, the first resistor being connected to a base of the transistor, and an emitter of the transistor being grounded.

2. The electronic pulse-generating device as claimed in claim 1, further comprising a detection circuit electronically connected to the input circuit.

3. The electronic pulse-generating device as claimed in claim 1, wherein one lead of the capacitor is electronically connected to the node between the second resistor and the third resistor, and the input connector is electronically connected to the capacitor via the second resistor.

4. The electronic pulse-generating device as claimed in claim 3, further comprising a detection circuit electronically connected to the node between the second resistor and the third resistor.

5. The electronic pulse-generating device as claimed in claim 4, wherein the detection circuit includes a MOSFET (Metal-Oxide-Semiconductor Field-Effect-Transistor) and a detection connector electronically connected to a drain of the MOPSET, a gate of the MOFSET being electronically connected to the node between the second resistor and the third resistor, a source of the MOFSET being grounded.

6. The electronic pulse-generating device as claimed in claim 5, further comprising a power supply electronically connected to the detection connector.

7. The electronic pulse-generating device as claimed in claim 1, further comprising a fourth resistor connected to the first resistor in series, the capacitor being grounded via the first resistor and the fourth resistor.

8. The electronic pulse-generating device as claimed in claim 7, wherein the base of the transistor is electronically connected to the node between the first resistor and the fourth resistor.

9. The electronic pulse-generating device as claimed in claim 1, further comprising a power supply electronically connected to the output connector.

* * * * *